United States Patent

Gregory et al.

[15] 3,643,176

[45] Feb. 15, 1972

[54] SUPERCONDUCTOR ELECTROMAGNETIC RADIATION DEVICE

[72] Inventors: William D. Gregory, Vienna, Va.; Lutz Leopold, Chevy Chase, Md.

[73] Assignee: Georgetown University, Washington, D.C.

[22] Filed: Sept. 30, 1968

[21] Appl. No.: 763,679

[52] U.S. Cl. ....................331/94.5, 331/94, 331/96, 331/107 S, 332/7.5, 332/7.51, 333/83

[51] Int. Cl. ....................H01s 1/02, H01s 3/08, H01s 3/16

[58] Field of Search ....................331/94, 94.5, 107 S; 307/306

[56] References Cited

UNITED STATES PATENTS

| | | | |
|---|---|---|---|
| 3,386,050 | 5/1968 | Dayem et al. | 331/107 |
| 3,423,607 | 1/1969 | Kunzler et al. | 331/107 |

OTHER PUBLICATIONS

Schrieffer, "Reviews of Modern Physics," Jan. 1964, p. 200, 331/107

Cook et al., "Physical Review," July 10, 1967, pp. 374–382, 331/107

Taylor, "Journal of Applied Physics," May 1968, pp. 2490–2495 and 2502 relied on. 331/107

*Primary Examiner*—John Kominski
*Assistant Examiner*—Darwin R. Hostetter
*Attorney*—Shlesinger, Arkwright & Garvey

[57] ABSTRACT

An injection-type junction superconducting radiation device, operated below the transition temperature of the superconductor. The junction is formed from a normal metal, an oxide insulative film and a superconductive material. The size of the superconductor element is determined by the radiation wavelength, and the index of refraction of the superconductor.

12 Claims, 6 Drawing Figures

FIG. 1
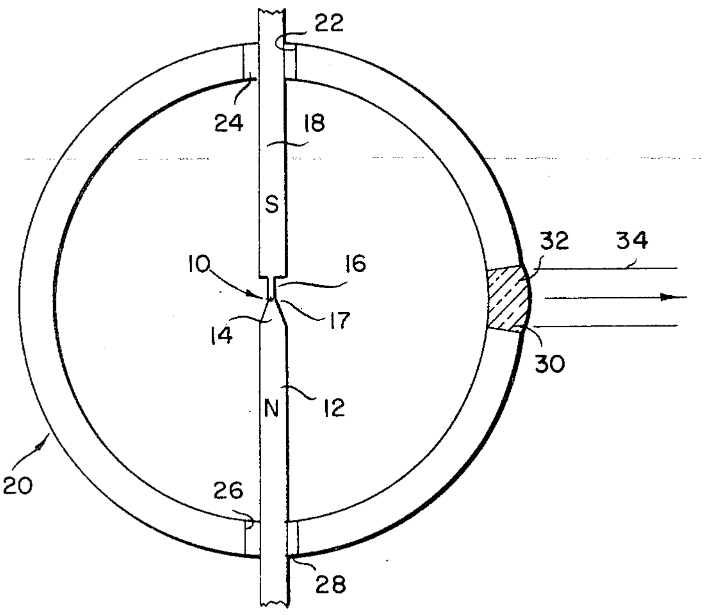
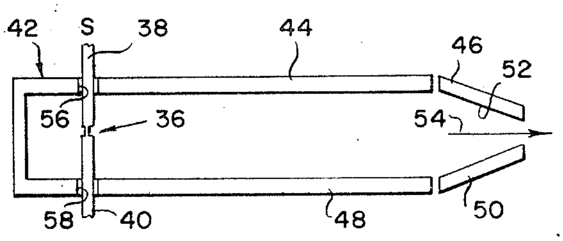
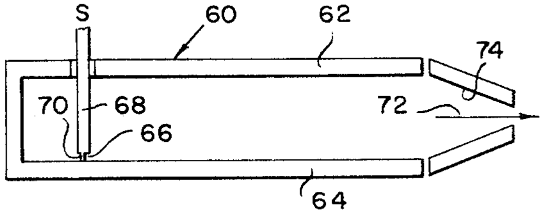
FIG. 2 FIG. 3
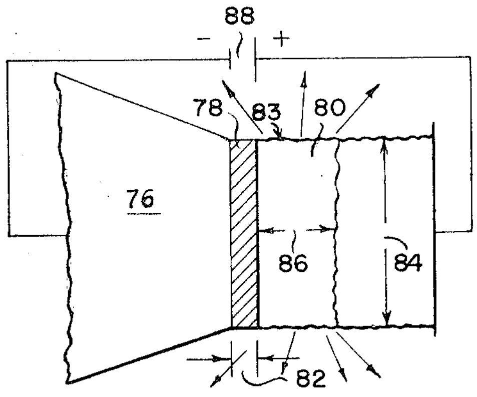
FIG. 4
INVENTORS
William D. Gregory
Lutz Leopold
BY Schlesinger, Arkwright & Garvey
ATTORNEYS INVENTORS
William D. Gregory
Lutz Leopold BY Schlesinger, Arkwright & Garvey

ATTORNEYS

SUPERCONDUCTOR ELECTRO-MAGNETIC RADIATION DEVICE

SUMMARY OF INVENTION

This invention relates to electromagnetic radiation devices, and particularly to a junction-type unit using superconductors.

Accordingly, it is a principal object of this invention to provide a laser or a microwave generating device, which employs a superconductor.

It is a further object of this invention to provide a laser using superconductors which will produce far infrared radiation which can be finely tuned.

It is a still further object of this invention to provide a radiation source for the far infrared which can be frequency modulated.

It is a still further object of this invention to provide a device which gives electromagnetic radiation in a narrow bandwidth.

It is a still further object of this invention to provide a junction-type laser which is self-sustaining, and does not require an external cavity.

A still further object of this invention is to provide a simple frequency standard for the infrared part of the spectrum.

These and further objects of this invention will become apparent from a reading of the following specification and claims.

DESCRIPTION OF THE DRAWINGS

FIG. 1 shows the superconductor junction source of this invention disposed in a radiation collecting sphere.

FIG. 2 shows a superconductor junction set in a microwave cavity.

FIG. 3 shows a modification of the junction of FIG. 2.

FIG. 4 is an enlargement of the junction, showing the critical dimensions of the junction.

DESCRIPTION

Figure 5:
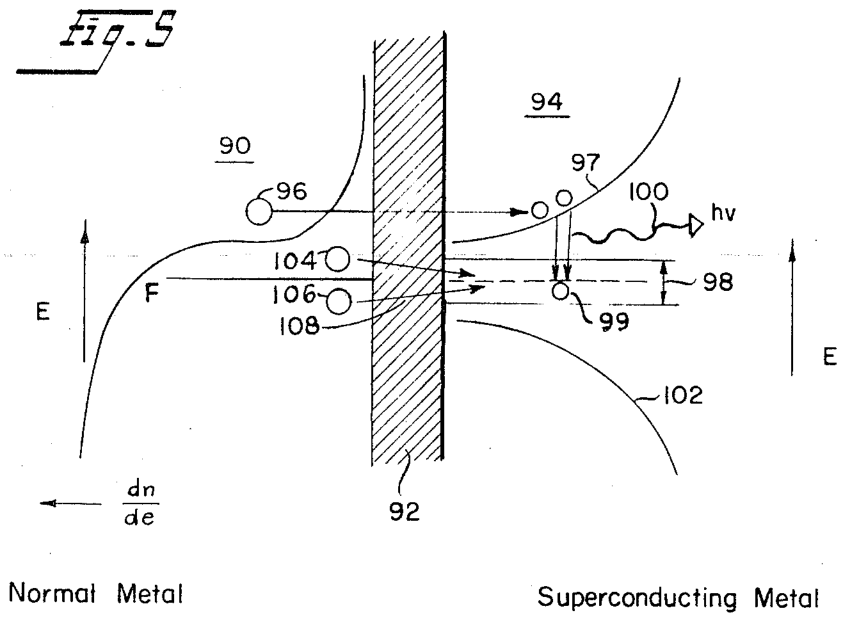
FIG. 5 is a diagrammatic illustration of particle activity and energy levels across the junction.

Referring particularly to FIG. 1, the junction generally indicated at 10 consists of a normal metal rod 12 having a contact section 14, coated with an oxide layer (not shown). A reduced size junction end 16 of superconductor rod 18 having a roughened radiation surface 17 is in direct contact with the oxide or insulator film.

A hollow metallic radiation collecting sphere 20 encloses the junction 10.

The superconductor rod passes out through the upper opening 22 of collecting sphere 20 and a dielectric ring 24 of approximately 1 mil thickness electrically insulates the superconductor rod from the sphere 20. Similarly, the normal metal rod 20 extends out through the lower opening 26 of the radiation collecting sphere 20, and dielectric ring 28 of approximately 1 mil thickness electrically insulates the normal metal rod 12 therefrom. The radiation sphere 20 has an exit opening 20 in which an exit pupil element 32 is mounted. The collected emitted radiation from the junction 10 leaves the collecting sphere 20 in the form of a beam 34 which passes through the exit pupil 32. The window may be either quartz or any transmitting material.

It should be noted that it is possible to use many different arrangements for collecting the radiation from the junction 10, and that the collecting sphere 20 is one example of different arrangements that might be used.

If microwave radiation is generated, radiation may be collected from the junction by a waveguide as shown in FIG. 2. The junction 36 having superconductor rod 38, and normal metal rod 40 in contact with each other, is enclosed by metallic waveguide 42. The upper plate 44 has a downwardly tapered end piece 46, while the lower plate 48 of the waveguide has an upwardly tapered endpiece 50. Both end pieces 46 and 48 are spaced slightly apart to define a reduced section exit opening for the collected microwaves 54. Rods 38 and 40 respectively pass through dielectric insulative bushings 56 and 58.

FIG. 3 shows a second modification of FIG. 2, wherein the waveguide generally indicated at 60 is rectangular in cross section preferably having an upper plate 62 and a lower plate 64. In this instance, instead of locating the junction centrally, as junction 36 in FIG. 2, the junction 66 is formed by extending the superconducting rod 68 through the waveguide and down into direct contact, through reduced size contact section 70, with the lower plate 64 of the metallic waveguide 60. The generated microwaves 72 are passed out through the opening 74.

FIG. 4 is an enlarged view of the junction showing the normal metal contact end section 76, and the insulative film 78 in contact with the superconductor 80. Any type of normal metal may be used. The insulative layer 78 is a thin oxide film, the dimension of which, indicated by 82, is important. It is approximately 5 angstrom units. The oxide film should be sufficiently thick to preclude multiple particle tunneling, but thin enough to avoid a sharp dropoff of tunneling current.

One of the important features of construction of the superconductor element is a roughening of the superconductor outer wall 83 to destroy the mirror properties thereof for phonon emission, while preserving a relatively smooth and mirrorlike finish for electromagnetic wavelengths to thereby effectively retard phonon emission while creating a more favorable condition for stimulated electromagnetic wave (photon) emission. For example, with an operating frequency having a free space wave length of 1 millimeter the wavelength inside the superconductor cavity will be in the order of 1 micron because the index of refraction of the superconductor is in the order of 1,000 when the phonon wavelength will be on the order of one-hundredth of a micron, a surface which presents a rough surface to the phonon wavelength but smooth to the electromagnetic wavelength of a few microns is required. The surface should have bumps or irregularities on it approximately one-hundredth of a micron to meet this requirement. This roughening can be accomplished by etching or pitting, or with other methods.

The cross-sectional width 84 (i.e., the diameter of the superconductor cavity and the length along which radiation travels) of the superconductor at the junction is also important, if radiation is to be successfully generated. The value must be equal to or greater than the free space wavelength of the radiation divided by twice the apparent index of refraction of the superconductor and should preferably be in multiples of one-half wavelength. Where the wavelength values are approximately 1 millimeter, the wavelength inside the superconductor cavity is in the order of a thousand times smaller and; the dimension will be at least micron sized. Similarly, the length of active or population inversion region of the superconductor (i.e., drift distance) indicated at 86 must also be equal to greater than one-half the free space wavelength divided by the apparent index of refraction of the superconductor. Its length can be greater than this but preferably should be in multiples of the wavelength divided by two.

It should be noted that in the construction of the junction, the insulative film may be applied to either the normal metal or the superconductor metal. Also, it is possible to electrodeposit the film. The normal metal and the superconductor metal can both be applied by electrodepositing also.

In a typical junction, such as those of FIGS. 1 to 3, the superconducting material is joined to the oxide layer of the normal metal over a cross-sectional area which is usually circular and has a diameter of one-half micron or greater. The width of the reduced section of the superconductor, such as 16 of FIG. 1 or 80 of FIG. 4 can be approximately 20 microns and up to 200 microns in width. A typical value of the length of the inversion length may be 2½ microns. A minimum value of the length 86 of this region is also set by the wavelength itself; it can be no less than one-half the wavelength of the electromagnetic radiation in the superconductor and its length preferably should be in even multiples of one-half this wavelength. An electrical current supply for the junction is illustrated diagrammatically at 88.

FIG. 5 illustrates diagrammatically, particle movement and energy level in the junction shown in FIG. 4.

The left-hand side of the drawing shows the density of filled energy levels per unit energy as a function of energy in the normal metal. The right-hand side shows the available density of levels for the superconductor. Notice that here is a peak in the density of filled states in the normal metal near the Fermi level. In addition, there is a forbidden gap in the superconductor located between the peaks of the density of states. There are no single-electron levels in this energy region but there is one state at the center of the gap that accepts pairs of electrons. When a voltage is applied between the normal and superconducting metal, some of the electrons in the normal metal can tunnel through the oxide layer. Because of the presence of the oxide layer the probability is greatest that only single-electrons tunnel. Consequently, the electrons will preferentially fill the upper set of energy levels in the superconductors since the lower set is already filled for thermodynamic reasons. In particular, the process illustrated in the diagram in which two electrons tunnel simultaneously into the paired state is forbidden. Because of the allowed tunneling process, the upper levels will now be overpopulated and tend to lose electrons which pair up and drop into the paired energy level. Some of the difference in energy between these two states is given off as radiation. It is this radiation which, when located in a properly formed tip, resonants in the cavity and stimulates further emission to provide lasing.

Referring particularly to FIG. 5, electrons pass from the normal metal 90, through the oxide film 92, and into the superconducting metal 94. A high-energy single particle 96 passes through the oxide layer 92 and into the high level uncondensed energy region above the line 97. It will then decay to the lower energy level, passing to the center of the transition region 98 to reach the position 99, giving off the excess energy in the form of radiation 100, in the course of its decay to the condensed state, bounded by the line 102. Electron 96 illustrates a single-particle current made up actually of many electrons. Some of these electrons give off electromagnetic radiation (photons). This radiation is trapped in the cavity (superconducting element or tip) and thereby stimulates more additional photon emission which produces lasing when the electromagnetic emission 100 is given off. There also is a double particle tunneling current illustrated by the electrons 104 and 106, which passes through the oxide layer 92 to the condensed state and inhibits lasing. The double particle currents require simultaneous tunneling of two electrons whose total energy equals the energy of the final paired state. The probability of double-particle tunneling units essentially the product of two single-particle tunneling probabilities. The ratio of double-particle to single-particle tunneling for even a thin oxide layer of 5 angstrom units, and a typical Fermi wavelength and overcome gap. of 5 angstrom units is approximately 1 to 100, so that the double-particle tunneling can be ignored and population inversion will occur for even the thinnest insulative layer. The fraction of decays that are radiative in a superconductor is very small, being in the order of one in 10 million, but with stimulated radiative emission, the radiative decay time is reduced considerably, and overcome by a threshold current on the order of 1 million amperes per centimeter squared, to produce lasing. However, this value can vary from 10,000 to 10 million amperes per centimeter squared. The magnitude of this threshold current for a 1 millimeter wavelength laser does not destroy the required energy gap through which radiative particles pass, since only a small magnetic field of approximately 50 gauss is produced. This is far below the field required to destroy the energy gap.

This current density is also sufficiently small to prevent destruction of the energy gap due to effects related to overpopulation of the uncondensed energy states, and to effects related directly to the size of the superconducting current density (independent of the magnetic field generated by the current). These effects do not destroy the gap until currents of 10 million amperes per centimeter squared are reached.

The presence of large amounts of nonradiative energy in the form of lattice vibrations or phonons at the energy gap frequency also can destroy electromagnetic lasing (photon) action, either by heating the junction above the critical temperature of the superconductor, or by producing phonon lasing action and stimulated emission of phonons. Lasing action of phonons is eliminated by making the sides 83 of the superconductor and elements sufficiently rough, to make reflection of phonons diffuse while reflection of electromagnetic (photon) radiation will be mirrorlike or specular. This was mentioned above in connection with the roughening of the superconductor outer wall 83.

It should be noted that the apparent index of refraction of the superconductor device is rather large, being on the order of one hundred to one thousand, and that this value, together with the wavelength, determines the physical dimensions of the point contact junction. The power reflectivity of the superconductor is the square of the index of refraction minus one divided by the index of refraction plus 1. Accordingly, the reflectivity approaches the value of one, indicating that the reflection at the air-metal interface will be very high, and therefore no mirrors are required.

Stimulated far infrared emission with a wavelength of one millimeter can be obtained from the construction shown in FIG. 4, with an electrical voltage of $1.25\times10^{-3}$ electron volts with the following different values assuming an apparent index of refraction of two thousand:

TABLE I

| Population inversion region length **86** is 2.5 microns cross section width **84** (microns) | threshold current (a./cm.$^2$) | (ma.) | induced magnetic field (gauss) |
|---|---|---|---|
| ¼ | $6.4\times10^3$ | 0.31 | 5 |
| 1 | $5.3\times10^3$ | 4.2 | 17 |
| 5 | $1.2\times10^3$ | 24 | 20 |

It will be noted that the magnetic fields due to the threshold currents are no greater than 50 gauss. Only a small decrease in energy gap size will occur for fields up to 100 gauss and additional effects due to large currents. The junction of FIG. 4 is produced by selecting a normal metal, and applying an oxide layer of sufficient thickness so that double particle tunneling is only a negligible part of the total current, that is at least 5 angstrom units thick. The superconducting element of the junction is made on a lathe to form a circular cylinder, with dimensions of 3 mils in diameter and 4 mils in length. The element is then etched and subsequently anodized, to bring the final dimensions to 5 microns in diameter and 30 microns in length. Anodizing of the elements protects them from obtaining impurities either by adhesion or diffusion. Impurities will greatly affect the superconducting properties of the superconductive elements.

The superconducting element and the oxide film on the normal metal are brought together to form a unitary piece, by means of pressure (10 to 100,000 dynes per centimeter squared). This technique for joining the two elements together to form a junction is illustrative of one of several ways in which the elements may be joined.

These junctions, because of the construction, including the relative dimensions of the superconductor element, the index of refraction of the material, and their conditioned surface to present a mirrorlike reflection of photons, form their own cavity to create radiation. Because of the extremely long wave length of the radiation, which is approximately 1 millimeter, as compared to the typical laser wavelength of one-half micron, it uses an external cavity, not for generation, but for providing a directional output which minimizes divergence.

Any superconductive material can be used for the superconductor element, although the elements tantalium and niobium, which have high-Debye temperatures are preferred.

Figure 6:
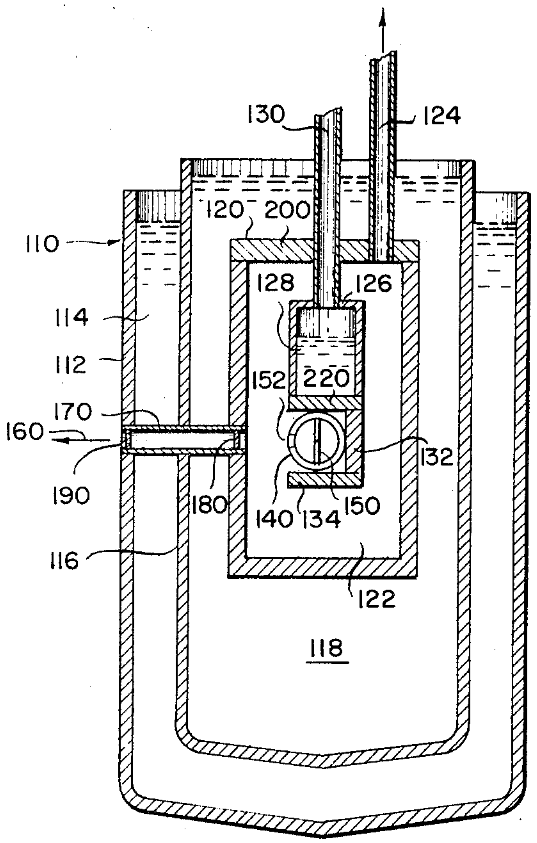
FIG. 6 shows the laser radiation unit of FIG. 1 in operative position within a cryostat unit.

Referring to FIG. 6, the laser or microwave junction and collecting sphere is mounted within the cryostat, generally indicated at 110, and used to cool the superconductor element. The normal operating range for the laser of the subject invention is between 1° to 5° K., is preferred, although the unit could operate from 0° to 20° K. The unit will operate effectively at any point up to the transition temperature of the superconductor.

The cryostat is a double-shell unit, having an outer container 112 filled with liquid nitrogen 114. The inner shell or container 116 is filled with liquid helium 118 and has a superconductor laser container 120 positioned therein. The interior 122 of the laser container 120 is maintained at a very high vacuum through the vacuum pipe 124, which is connected to a vacuum pump not shown. An inner liquid helium container 126 is filled with liquid helium 128 and may be pumped on through the stainless steel tube 130 which is connected to a vacuum pump not shown.

Beneath the inner liquid helium container 126 is a low-thermal conducting rod 132 having a supporter member 134 rigidly attached thereto, on which a hollow metallic radiation conducting sphere 140 is supported. The superconductor radiation junction 150 is mounted therein. The electrical conducting wires are not shown. The window 152 permits radiation 160 to pass out from the interior of the collecting sphere 140, where it then passes from the interior of the cryostat 110 to the outside thereof through the stainless steel radiation conducting tube 170 which passes through the walls of containers 120, 116, and 112. Windows 180 and 190 are mounted within the tube, providing a vacuum between the interior of the cryostat and atmosphere. The windows may be made of germanium or quartz, through which far infrared radiation will readily pass. It is also possible to use a light pipe or wave guide to carry the radiations up through the Dewar vessel instead of using the conducting tube 170.

The cryostat should be capable of cooling the junctions below the critical temperature and steadily maintaining it at that value. The operating temperature is controlling on the energy gap over which the superconductor laser operates, and consequently must be fixed to keep the frequency and power level of the laser from varying.

Any liquid helium cryostat permitting pumping of the liquid helium bath for temperature reduction will attain the necessary low-operating temperature. To prevent temperature variance, the collecting sphere 140 is thermally isolated from the cooling bath by supporting it in a vacuum and connecting it with the cooling bath through a low-thermal conductivity rod 132. Also successive stages of cooling, both of which can be pumped on separately, are used. In addition, the support member 134 is a block of copper; the upper wall 200 of container 120, and the lower wall 220 of container 126 are blocks of copper or similar property material.

The cryostat of FIG. 6 will limit temperature fluctuations at the specimen to only a small fraction of a degree at 4° K. This temperature control will be more than sufficient to permit power and frequency fluctuation of the laser to be disregarded.

The superconductor junction described above will produce coherent radiation such as a laser beam, or a microwave radiation. The unit is tunable over a range from about 300 microns wavelength to approximately a 1 to 4 millimeter wavelength.

Although the device is tunable over a wide range of wavelengths and of frequencies, the power output is confined to a range of one tenth of one percent or less of the selected center frequency or wavelength.

The radiation is in the far infrared and microwave region, since the device makes use of the far infrared and microwave energy gap between the normal and superconducting states of the superconductor. The radiation is tunable and it can be frequency modulated by modulating the direct current applied to the junction, or by changing the temperature of the junction.

The device can also be used in absorption spectroscopy as both a source and a dispersive element using its properties in the infrared region. In this type of application of the device the need for expensive auxiliary equipment, such as large mirrors, which may be 2 to 3 feet in diameter and large diffraction gratings, measuring 1 to 2 square feet, which equipment is expensive and cumbersome, is eliminated.

Frequency modulation of the superconductor tunneling junction described can readily be accomplished by modulating the direct current, or by changing the temperature at the junction.

The superconductor junction device has useful application wherever a narrow band radiation source is desired, whether in the infrared frequency band or other bands. To make use of such radiation outside of the infrared frequencies, conventional frequency multiplication devices can be used.

The superconductor radiation device of this invention uses the energy gap in the superconductor element to obtain radiation as the particles of high-energy drop from the uncondensed high-energy level to the condensed state in the transition zone of the superconductor. The ability of the unit to radiate such energy depends upon the size of the superconductor element, particularly its cross-sectional area, and the current passed through the junction. The superconductor energy gap is particularly sensitive to temperature and current, permitting the device to readily be tuned by varying either of these parameters.

While the invention has been described, it will be understood that it is capable of further modifications and this application is intended to cover any variations, uses, or adaptations of the invention following in general, the principles of the invention and including such departures from the present disclosure as come within known or customary practice in the art to which the invention pertains, and as may be applied to the essential features hereinbefore set forth and as fall within the scope of the invention or the limits of the appended claims.

What we claim is:

1. A radiation device, comprising:

a. a superconductor having a conductive point contact element which forms a resonant cavity for maintaining standing waves of radiation therein and has an end conductive surface, b. the length and the width of the point contact resonant cavity each being at least one half the wave length of the radiation to be generated therein, and sufficiently small to permit high density current flow to produce lasing without creating a field to destroy electromagnetic radiation, c. a normal conductor having a conductive surface, d. an intermediate insulative film disposed between and in contact with both conducting surfaces to form a barrier permitting current flow of sufficient density to create a state of population inversion, and to sustain electromagnetic resonance within the resonant cavity e. the outer surface of the point contact element being parallel to its central axis and being treated to diffusely reflect phonons, F. temperature control means surrounding the formed injection junction for maintaining it at a temperature below the transition temperature of the superconductor, g. electrical means connected across the formed injection junction for providing an electron flow across the insulative film and into the point contact element of sufficient current density to create a state of population inversion by overpopulating the uncondensed single-particle energy level, whereby the emission rate for photons is increased to a level above the spontaneous phonon emission level to thereby create radiation from the point contact element.

2. The radiation device of claim 1, wherein:

a. the length of the active region in the superconductor point contact element is greater than one-half micron.

3. The radiation device of claim 1, wherein:
a. the intermediate insulative film is an oxide layer having a thickness from 5 angstrom units to 2,000 angstrom units.

4. The radiation device of claim 1, wherein:
a. the voltage drop across said junction is maintained at greater than 0.001 electron volts.

5. The radiation device of claim 1, wherein:
a. the current density across the injection junction is at least ½ million amperes per centimeter squared.

6. The radiation device of claim 1, wherein:
a. the means for maintaining the injection junction below the transition temperature includes means for varying the temperature for controlling the radiated frequency output.

7. The radiation device of claim 1, wherein:
a. the point contact element is cylindrical, and has its outer surface roughened to diffusely reflect phonons.

8. The radiation device of claim 1, wherein:
a. the point contact element is cylindrical in shape, and has its outer surface etched.

9. The radiation device as set forth in claim 1, wherein:
a. the outer surface of the point contact element is coated to preserve the purity of the surface layers thereof.

10. The radiation device of claim 1, wherein:
a. the means for controlling the temperature of the injection junction is sealed and includes means for evacuating the interior thereof.

11. The radiation device of claim 1, wherein:
a. the outer surface of the point contact element has irregularities thereon approximately half the size of the phonon wave length, and very much smaller in size than the electromagnetic wave length.

12. The radiation device set forth in claim 11, wherein:
a. the size of the irregularities on the surface of the point contact element are approximately one hundredth the wave length of the electromagnetic radiation.

* * * * *